United States Patent
Masuda

(10) Patent No.: US 9,161,438 B2
(45) Date of Patent: Oct. 13, 2015

(54) STRESS BUFFER LAYER AND METHOD FOR PRODUCING SAME

(75) Inventor: Hidetoshi Masuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 374 days.

(21) Appl. No.: 13/638,518

(22) PCT Filed: Mar. 24, 2011

(86) PCT No.: PCT/JP2011/057099
§ 371 (c)(1),
(2), (4) Date: Dec. 13, 2012

(87) PCT Pub. No.: WO2011/125506
PCT Pub. Date: Oct. 13, 2011

(65) Prior Publication Data
US 2013/0092424 A1    Apr. 18, 2013

(30) Foreign Application Priority Data

Mar. 31, 2010    (JP) .................................. 2010-082313

(51) Int. Cl.
*H05K 1/02*    (2006.01)
*H05K 1/03*    (2006.01)
(Continued)

(52) U.S. Cl.
CPC ............ *H05K 1/0271* (2013.01); *H01R 43/007* (2013.01); *H05K 1/03* (2013.01); *H05K 1/0306* (2013.01); *H05K 1/18* (2013.01); *H05K 3/32* (2013.01); *H05K 3/3431* (2013.01);
(Continued)

(58) Field of Classification Search
CPC ......... H05K 1/0271; H05K 1/18; H05K 1/03; H05K 1/0306

USPC ............................. 174/257, 260, 258; 216/13
See application file for complete search history.

(56) References Cited

U.S. PATENT DOCUMENTS 5,262,226 A * 11/1993 Yoshida ........................ 428/209

FOREIGN PATENT DOCUMENTS

JP    03-285213    12/1991
JP    3-285213 A    12/1991
(Continued)

OTHER PUBLICATIONS

ASI Adhesives & Sealant, Jun. 1, 2004.*
(Continued)

*Primary Examiner* — Timothy Thompson
*Assistant Examiner* — Charles Pizzuto
(74) *Attorney, Agent, or Firm* — Pillsbury Winthrop Shaw Pittman, LLP

(57) ABSTRACT

A stress buffer sheet 10 is constituted by arranging external conductive layers 16A and 16B on the front and rear main surfaces of a through electrode layer 13. Columnar internal electrodes 14 are formed using a porous oxide base material 30 formed by anodic oxidation of valve metal; the oxide base material 30 is selectively removed after the internal electrodes 14 have been formed, and a resin 12 is filled in a resultant void space. The resin 12 has a small Young's modulus and can be deformed together with the internal electrode 14. In a structure having a wiring board 20 and an electronic component 24 connected through the stress buffer sheet 10, when stress acts on the joint portion during mounting of the electronic component 24, the whole of the through electrode layer 13 is deformed so that the stress is absorbed or released.

3 Claims, 6 Drawing Sheets

(51) Int. Cl.
  *H05K 1/18* (2006.01)
  *H01R 43/00* (2006.01)
  *H05K 3/32* (2006.01)
  *H05K 3/34* (2006.01)
  *H01R 13/24* (2006.01)

(52) U.S. Cl.
  CPC .. *H01R13/2414* (2013.01); *H05K 2201/10378* (2013.01); *H05K 2201/10636* (2013.01); *H05K 2201/10674* (2013.01); *H05K 2201/10962* (2013.01)

(56) References Cited

FOREIGN PATENT DOCUMENTS

| | | |
|---|---|---|
| JP | 04-126307 | 4/1992 |
| JP | 4-126307 A | 4/1992 |
| JP | 10-050145 * | 2/1998 |
| JP | 10-50145 A | 2/1998 |
| JP | 2008-205184 | 9/2008 |
| JP | 2008-227020 | 9/2008 |
| JP | 2008-244311 | 10/2008 |

OTHER PUBLICATIONS

Cease et al., Measurements of mechanical properties of three epoxy adhesives at cryogenic temperatures for CCD construction, Nov. 6, 2006.*

MEMSnet, Nov. 18, 2014.*

International Search Report of PCT/JP2011/057099 filed Mar. 24, 2011 dated Jun. 28, 2011 (1 page).

English Translation of Written Opinion mailed Jun. 28, 2011, for PCT/JP2011/057099.

* cited by examiner

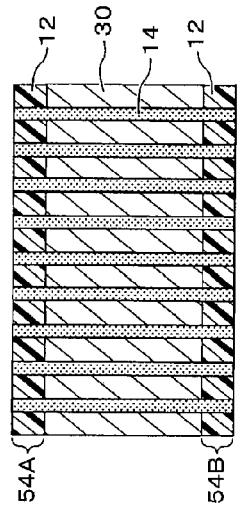
FIG. 5(A)
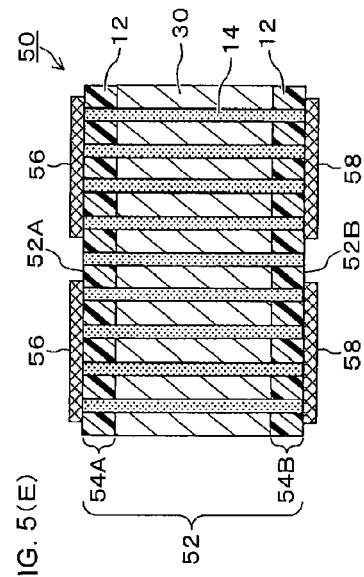
FIG. 5(B)
FIG. 5(C)
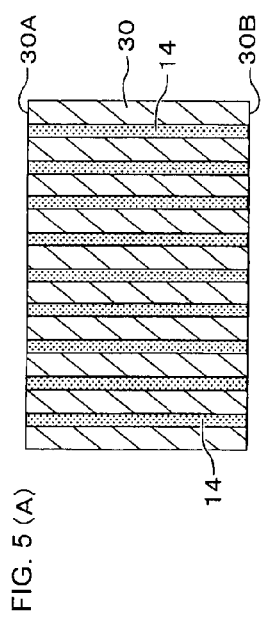
FIG. 5(D)
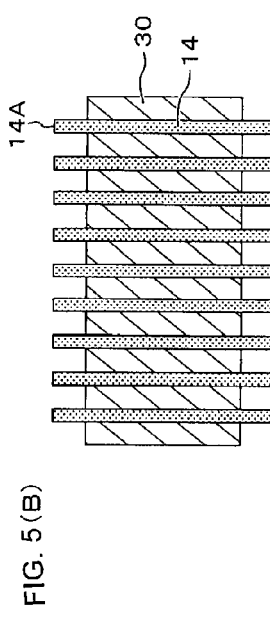
FIG. 5(E)
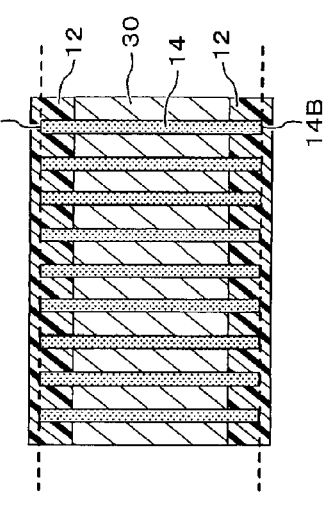

STRESS BUFFER LAYER AND METHOD FOR PRODUCING SAME

CROSS-REFERENCE TO RELATED APPLICATIONS

This application is a U.S. National Stage application under 35 USC §371 of PCT/JP2011/057099 filed 24 Mar. 2011, which claims priority under the Paris Convention to Japanese Patent Application No. 2010-082313 filed 31 Mar. 2010, the entire contents of each of these applications being incorporated herein by reference.

TECHNICAL FIELD

The present invention relates to a stress buffer layer, and more particularly to a stress buffer layer and a method for producing the stress buffer layer, suitable for release of stress acting on a joint portion or the like between a printed board and a chip component and also suitable for improvement in reliability in mounting a component.

BACKGROUND ART

When a chip component is mounted on a printed board, a method is typically used in which the chip component and the printed board are electrically connected through soldering. Further, in order to add a function to vary wiring pitches and a function to perform rewiring, an interposer may be placed between the chip component and the printed board. In general, different constituent materials are used for the printed board, the interposer and the chip component; accordingly, the magnitude of thermal expansion of these parts during a process or under use environment conditions differs from each other. Consequently, stress acts exclusively on solder joint portions in which the printed board, the interposer and the chip component are connected to each other through soldering; thus, poor connection caused by cracks or the like may occur. Therefore, there is a need for a structure which can release the stress acting on the solder joint portion.

Japanese Patent Laid-Open No. 2008-244311 (Patent Literature 1) discloses a technique for releasing this stress acting on the solder joint portion. A semiconductor package board described in Patent Literature 1 is characterized by including a first circuit conductive layer electrically connected to a semiconductor device, a second circuit conductive layer having a connecting terminal used for electrical connection with an external component, an insulating layer disposed between the first circuit conductive layer and the second circuit conductive layer, and a via which is a through hole in the insulating layer, used for electrical connection of the first circuit conductive layer and the second circuit conductive layer, and also characterized in that the insulating layer has a dual-layer structure, and Young's modulus of a second insulating layer disposed on the side of the second circuit conductive layer is smaller than that of a first insulating layer disposed on the side of the first circuit conductive layer.

Japanese Patent Laid-Open No. 2008-227020 (Patent Literature 2) discloses another example. In Patent Literature 2, an electronic component mounting structure is used in which an electronic component chip having a plurality of protrusion electrodes distributed on the whole mounting surface thereof is mounted via the protrusion electrodes on a substrate. An object of the invention is to release stress produced in the protrusion electrodes caused by temperature rise during the operation of the electronic component and thereby improve the reliability of the electronic component; and a disclosed solution is that the protrusion electrodes are arranged so that the distribution density of the protrusion electrodes becomes higher in a direction from the center to the outer side of the mounting surface of the electronic component chip. In Patent Literature 2, solder bump is given as an illustrative example of the protrusion electrode.

Japanese Patent Laid-Open No. 2008-205184 (Patent Literature 3) discloses a mounting structure in which a connecting terminal of a semiconductor device is electrically connected through a connecting member to a circuit board, and the connecting member has a conductive protrusion including a columnar portion, and the cross-sectional area of the columnar portion being the result of cutting the columnar portion by a plane parallel to the surface of the semiconductor device is smaller than the surface area of the connecting terminal of the semiconductor device. The circuit board and the semiconductor device are electrically connected through the conductive portion of the connecting member.

CITATION LIST

Patent Literature

Patent Literature 1: Japanese Patent Laid-Open No. 2008-244311 (FIG. 1)
Patent Literature 2: Japanese Patent Laid-Open No. 2008-227020 (FIG. 1)
Patent Literature 3: Japanese Patent Laid-Open No. 2008-205184 (FIG. 2)

SUMMARY OF INVENTION

Technical Problem

However, the aforementioned background art has the following problems. That is, a problem with the techniques described in Patent Literature 1 and Patent Literature 2 is that the effect of releasing stress acting on the joint portion is indirectly achieved and thus the stress on the joint portion cannot be directly released; consequently, the stress releasing effect is small. A problem with the technique described in Patent Literature 3 is that the member used for releasing the stress is as large as electrodes and thus a displacement sufficient for releasing the stress cannot be produced; consequently, the stress acting on the joint portion is not completely absorbed.

An embodiment of the present invention provides a stress buffer layer which satisfactorily releases stress acting on the joint portion, allowing an improvement in mounting reliability.

Solution To Problem

A stress buffer layer according to an embodiment of the present invention is one on which an electronic component can be mounted, and is characterized by including a through electrode layer having many internal electrodes obtained by filling a conductive material in many holes of a plate-like base material, the many holes penetrating through the base material in a direction of thickness, the plate-like base material being constituted by replacing at least a part of a porous oxide base material formed by anodic oxidation of valve metal with an insulating material having a Young's modulus smaller than the oxide base material.

A stress buffer layer according to an embodiment of the present invention is characterized in that an insulating material having a Young's modulus smaller than the oxide base material is disposed close to both of the main surfaces of the plate-like base material. Another embodiment is characterized in that the insulating material having a smaller Young's modulus is resin. Another embodiment is characterized by including external conductive layers which are disposed on both of the main surfaces of the through electrode layer and which are conductively connected to each other via at least a part of the many internal electrodes. Another embodiment is characterized in that a flexible layer of resin covering that end portion of the internal electrode which is not connected to the external conductive layer is disposed on both of the main surfaces of the through electrode layer. The aforementioned and another object, feature and advantage of the present invention will be made clear by detailed explanations and accompanying drawings given below.

Advantageous Effects of Invention

An embodiment of the present invention provides a stress buffer layer which satisfactorily releases stress acting on a joint portion, allowing an improvement in mounting reliability.

BRIEF DESCRIPTION OF DRAWINGS

FIG. 1 is a view illustrating Embodiment 1 of the present invention.

FIG. 4 is a view illustrating an interposer according to Embodiment 2 of the present invention.

FIG. 5 is a view illustrating an example of production process of the interposer according to Embodiment 2.

DESCRIPTION OF EMBODIMENTS

Embodiments for carrying out the present invention will be described in detail below with reference to examples.

Embodiment 1

Figure 1A:
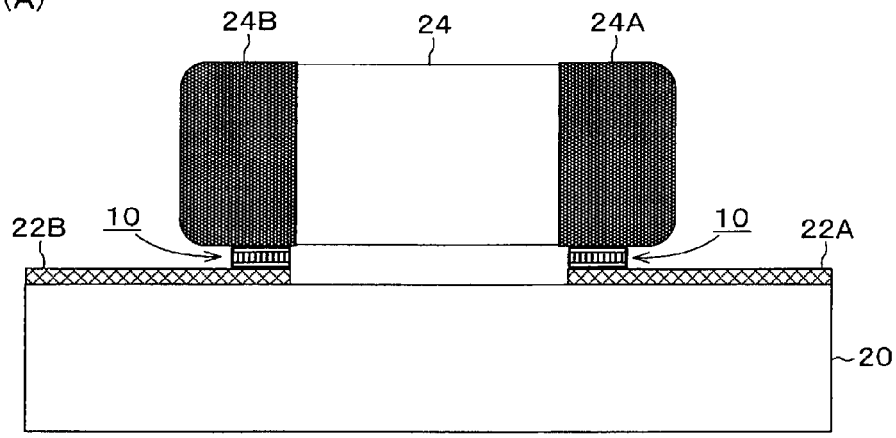
FIG. 1(A) is a view illustrating a state in which the embodiment is applied to mounting of a component.
Figure 1B:
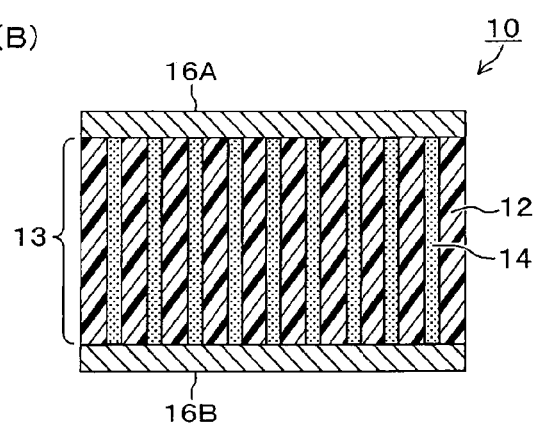
FIG. 1(B) is a main cross-sectional view of a stress buffer sheet according to the embodiment.
Figure 1C:
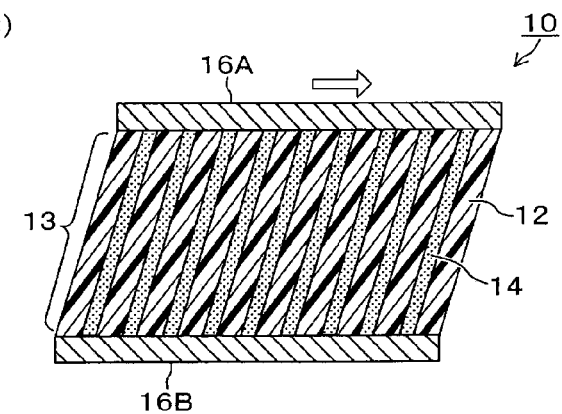
FIG. 1(C) is a cross-sectional view showing an operation of the stress buffer sheet.
Figure 2:
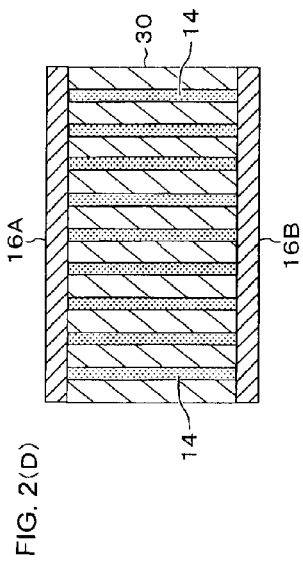
FIG. 2 is a cross-sectional view illustrating an example of production process of the stress buffer sheet according to Embodiment 1.
Figure 2:
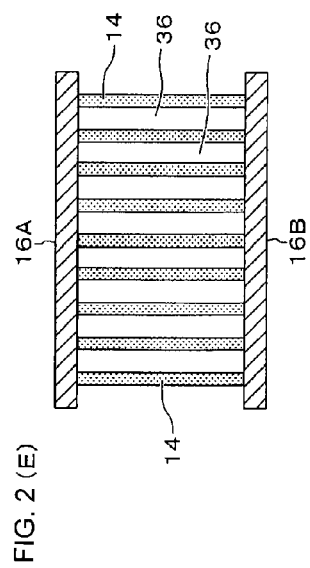
Figure 2:
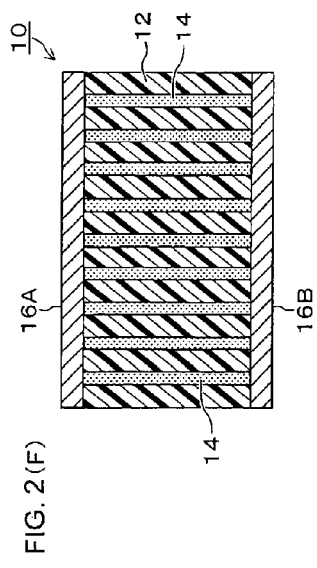
Figure 2:
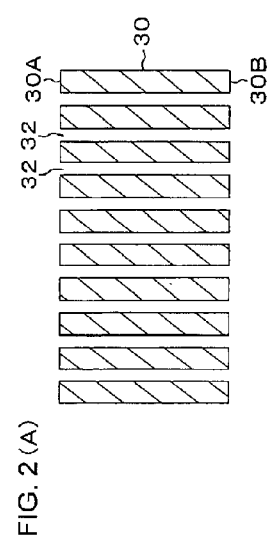
Figure 2:
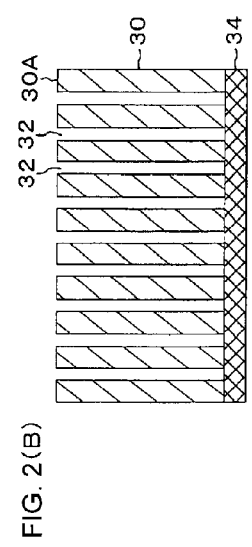
Figure 2:
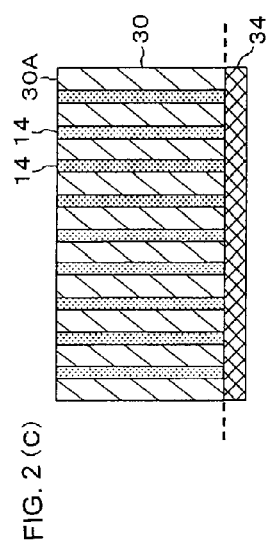
Figure 3:
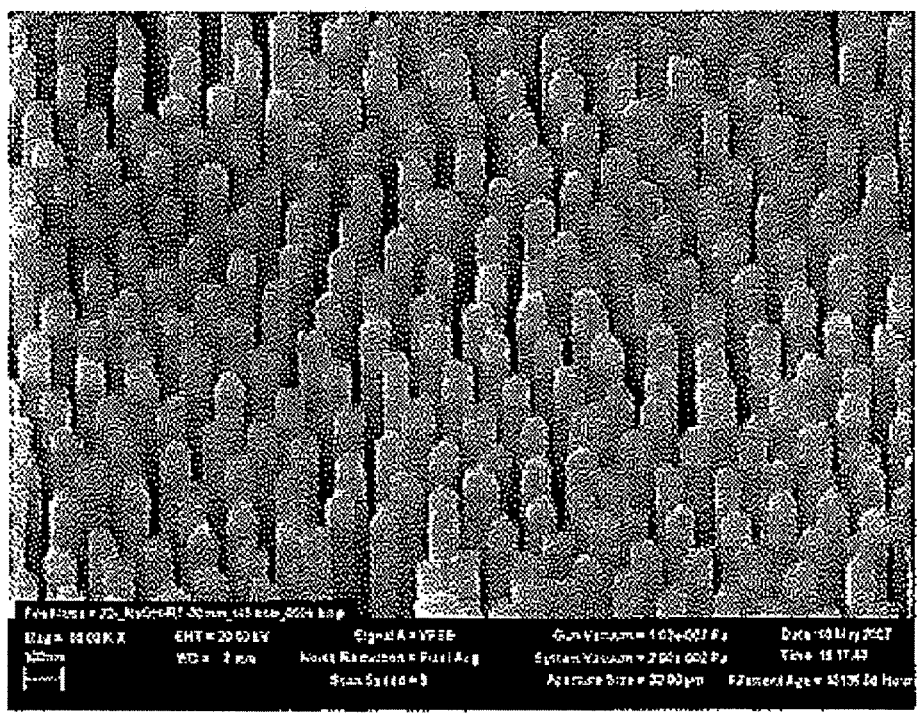
FIG. 3 is an SEM image showing a nanopillar array of metal formed in the process of FIG. 2(E).

First, Embodiment 1 of the present invention will be described with reference to FIGS. 1 to 3. In the present embodiment, the invention is applied to a stress buffer sheet used as a joint member between a wiring board and an electronic component. FIG. 1(A) is a view illustrating a state in which the embodiment is applied to mounting of a component; FIG. 1(B) is a main cross-sectional view of a stress buffer sheet according to the embodiment; and FIG. 1(C) is a cross-sectional view showing an operation of the stress buffer sheet. FIG. 2 is a cross-sectional view illustrating an example of production process of the stress buffer sheet according to the present embodiment. FIG. 3 is an SEM image showing a nanopillar array of metal formed in the process of FIG. 2(E). The stress buffer sheet 10 according to the present embodiment is used, for example as illustrated in FIG. 1(A), as a joint member between terminal units 22A and 22B of a wiring board 20 and terminal units 24A and 24B of an electronic component 24. The stress buffer sheet 10 absorbs or releases stress caused by the difference of thermal expansion coefficient between the above members when heat is produced in a process for mounting the electronic component 24 on the wiring board 20 or under use environment conditions.

The stress buffer sheet 10 according to the present embodiment includes, as illustrated in FIG. 1(B), a through electrode layer 13 having resin 12 filled between many columnar internal electrodes (metal pillars) 14 and external conductive layers 16A and 16B disposed on the front and rear main surfaces (i.e., top and bottom surfaces) of the through electrode layer 13. The many internal electrodes 14 are formed, as described later, using a porous oxide base material 30 (refer to FIG. 2) produced by anodic oxidation of valve metal; the oxide base material 30 is removed after the internal electrodes 14 have been formed, and the resin 12 having a Young's modulus smaller than the oxide base material 30 is filled as a replacement. The internal electrode 14 has a high aspect ratio and a remarkable flexibility. In this specification, the term "aspect ratio" of the internal electrode 14 means the ratio of diameter to length (thickness) of the internal electrode 14. The resin 12 is also small in Young's modulus and can be deformed together with the internal electrode 14. Accordingly, in a structure having the wiring board 20 and the electronic component 24 connected through the stress buffer sheet 10, when stress acts on the joint portion, the internal electrode 14 and the resin 12, i.e., the whole of the through electrode layer 13 is, as illustrated in FIG. 1(C), deformed as indicated by the arrow in FIG. 1(C) and absorbs the stress.

An example of production method according to the present embodiment will be described with reference to FIG. 2. First, an oxide base material 30 is, as illustrated in FIG. 2(A), prepared which has many holes 32 of a high aspect ratio produced by anodic oxidation of valve metal. In the present embodiment, Al (aluminum) is used as valve metal to produce the oxide base material 30 (porous $Al_2O_3$). In this case, a well-known method for forming the holes 32 by use of anodic oxidation is used. Subsequently, a seed layer 34 is, as illustrated in FIG. 2(B), formed on the main surface 30B of the oxide base material 30. Using the seed layer 34 as a seed, plated electrical conductor is, as illustrated in FIG. 2(C), filled as an electrode material in the inner side of the holes 32 to form many internal electrodes 14. The internal electrode 14 does not need to be formed in all of the many holes 32 of the oxide base material 30; it is sufficient to achieve an electrical resistance satisfactorily low according to applications between the top and bottom surfaces of the stress buffer sheet 10 after forming of the stress buffer sheet 10. Both ends of the internal electrode 14 are, as evident from FIG. 2(C), formed so as to be substantially on the same plane as the top and bottom surfaces of the oxide base material 30. Subsequently, the seed layer 34 is removed at the position indicated by the broken line in FIG. 2(C); and external conductive layers 16A and 16B are, as illustrated in FIG. 2(D), arranged on the two main surfaces 30A and 30B of the oxide base material 30, respectively. The external conductive layers 16A and 16B are provided on at least one of the two main surfaces 30A and 30B of the oxide base material 30 so as to be electrically connected to the internal electrode 14. The internal electrode 14 is constituted so as to have a surface substantially on the same plane as the two main surfaces 30A and 30B of the oxide base material 30; thus, when the external conductive layers 16A and 16B are placed on the two main surfaces 30A and 30B of the oxide base material 30, electrical connection with the internal electrode 14 is achieved. Then, when the oxide base material 30 is, as illustrated in FIG. 2(E), selectively removed, a metal nanopillar array is formed which includes the internal electrodes 14 having a diameter of several dozen to several hundred nm and a length (thickness) of several hundred nm to several dozen μm. FIG. 2(E) illustrates an example in which the oxide base material 30 is wholly removed, but only a part of the oxide base material 30 may be removed. FIG. 3 shows an SEM image of metal nanopillar array formed by using Ni as the plated electrical conductor and using NaOH as chemical solution used for selective removal in the process of FIG. 2(E).

Finally, the resin 12 is impregnated in a void space 36 (i.e., the part being the result of removing the oxide base material 30) illustrated in FIG. 2(E), whereby the stress buffer sheet 10 is produced. In the present embodiment, the oxide base material 30 removed in the process illustrated in FIG. 2(E) is alumina which has a Young's modulus of about 400 GPa. Meanwhile, the Young's modulus of the resin 12 filled in the void space 36 in the process of FIG. 2(F) is 0.01 to 1 GPa for epoxy, 1 to 5 GPa for Silicone resin, 1 to 5 GPa for polyimide, 1 to 5 GPa for BCB, for example. In this way, the resin 12 has a Young's modulus smaller than the oxide base material 30 and thus does not impede deformation of the internal electrode 14 having flexibility and can be elastically deformed integrally with the internal electrode 14.

The stress buffer sheet 10 is mounted, for example, on an external connection terminal unit (the terminal units 24A and 24B or the like of the electronic component 24 of FIG. 1) of a semiconductor chip, and the resultant product is provided for a user. In a case where the user mounts the semiconductor chip with the stress buffer sheet 10 on the wiring board 20, a difference of displacement may occur between the board and the chip caused by thermal expansion and the like. However, the stress buffer sheet 10 deforms, as illustrated in FIG. 1(C), and absorbs the difference, so that an excellent terminal connection is ensured.

Examples of the resin 12 include epoxy, Silicone resin, polyimide and BCB (benzocyclobutene resin). In the present embodiment, in order to achieve greater ease of mounting, the external conductive layers 16A and 16B are formed by solder. As the plated electrical conductor which constitutes the internal electrode 14, a low-resistance metal on which plating can be made and which has a high ductility is preferably used; for example, Au, Cu and Ag. As described above, when a chip (electronic component) with the stress buffer sheet 10 according to the present embodiment mounted thereon can be provided, the user side does not need to modify the mounting process, which is preferable. Alternatively, the internal electrode 14 may be directly formed on a pad (terminal unit) of the chip. Further, in order to ensure chemical and mechanical strength of the stress buffer sheet 10, another electrical conductor may be arranged between the internal electrode 14 and the external conductive layers 16A and 16B.

In the stress buffer sheet 10 mounted, as described above, on the wiring board 20, the effective cross-sectional area for current path is half to one third the area of the sheet, for example; but, since the joint is performed using a plurality of the internal electrodes 14 made of metal, a satisfactorily low resistance value is ensured. The overall thickness of the stress buffer sheet 10 is several hundred nm to several dozen μ, for example; and the aspect ratio (AR ratio) of the internal electrode 14 is several dozen to several thousand.

In this way, according to Embodiment 1, the porous oxide base material 30 being the result of anodic oxidation of valve metal is used as a mold, and many internal electrodes 14 penetrating through the oxide base material 30 in a direction of thickness are formed and thereafter, the oxide base material 30 is selectively removed to form a metal nanopillar array and then the resin 12 having a Young's modulus smaller than the oxide base material 30 is filled in the void space 36 of the metal nanopillar array, whereby the through electrode layer 13 is provided. Then, the wiring board 20 and the electronic component 24 are joined via the external conductive layers 16A and 16B disposed on the front and rear surfaces of the through electrode layer 13. Accordingly, when heat is produced in the process or under use environment conditions, stress caused by a difference of thermal expansion coefficient between the above members is absorbed by the stress buffer sheet 10 in which deformation of the internal electrode 14 having flexibility is utilized, so that the reliability of joint between the wiring board 20 and the electronic component 24 is improved. Further, since the internal electrode 14 is formed in a shape of array, the number of connection points increases, so that an excellent mechanical strength of the joint portion and a satisfactorily low connection resistance are ensured.

Embodiment 2

Figure 4A:
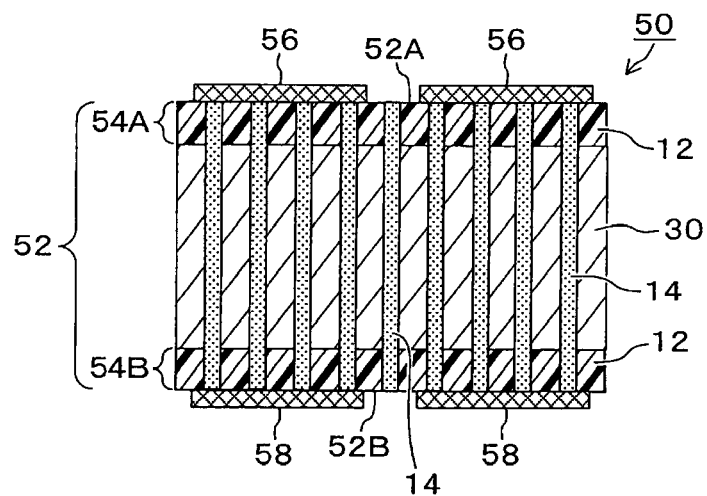
FIG. 4(A) is a main cross-sectional view.
Figure 4B:
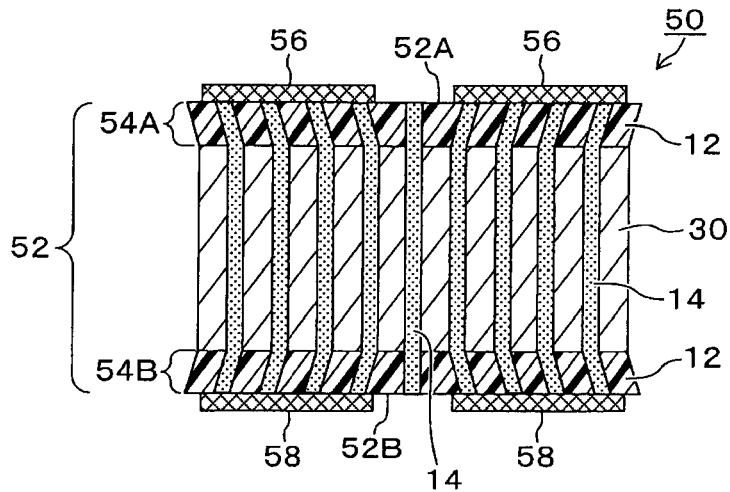
FIG. 4(B) is a cross-sectional view showing a state where stress is applied.
Figure 6:
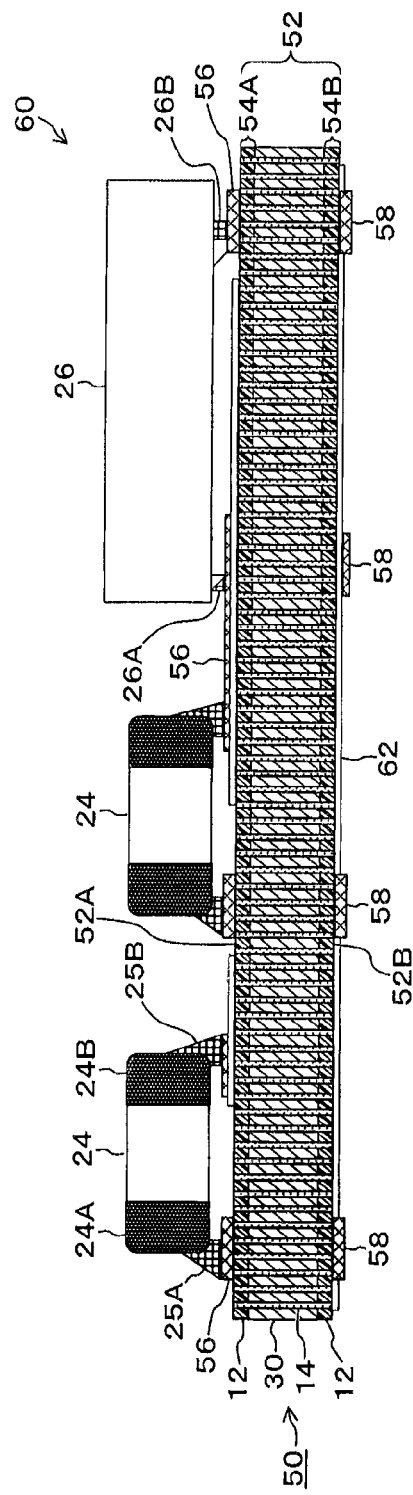
FIG. 6 is a cross-sectional view illustrating an example of circuit module using the interposer according to Embodiment 2.

Embodiment 2 of the present invention will be described with reference to FIGS. 4 to 6. In the present embodiment, the invention is applied to an interposer. FIG. 4 is a view illustrating an interposer according to the present embodiment; FIG. 4(A) is a main cross-sectional view; FIG. 4(B) is a cross-sectional view showing a state where stress is applied. FIG. 5 is a view illustrating an example of production process of the interposer according to the present embodiment. FIG. 6 is a cross-sectional view illustrating an example of circuit module using the interposer according to the present embodiment. The same reference characters are applied to constituent parts identical or corresponding to those of Embodiment 1 described above. An interposer 50 according to the present embodiment includes, as illustrated in FIG. 4(A), a through electrode layer 52 having many columnar internal electrodes 14 penetrating therethrough in a direction of thickness, and external conductive layers 56 and 58 arranged so as to be conductively connected to a part of the many internal electrodes 14 on the front and rear main surfaces 52A and 52B of the through electrode layer 52. The through electrode layer 52 according to the present embodiment includes a porous oxide base material 30 being the result of anodic oxidation of valve metal, and stress buffer units 54A and 54B, formed of a resin 12, disposed close to the front and rear surfaces (top and bottom surfaces) of the oxide base material 30. In the stress buffer units 54A and 54B, the resin 12, having a Young's modulus smaller than the oxide base material 30, does not impede flexibility of the internal electrode 14; thus, upon receiving stress, the stress buffer units 54A and 54B deform as illustrated in FIG. 4(B) and the stress is absorbed or released.

An example of production process according to the present embodiment will be described with reference to FIG. 5. First, similarly to the process illustrated in FIGS. 2(A) to 2(C) of Embodiment 1 described above, many internal electrodes 14 penetrating through the oxide base material 30 in a direction of thickness are formed using many holes of the oxide base material 30 being the result of anodic oxidation of valve metal. Materials similar to those of Embodiment 1 are used as the materials for the oxide base material 30 and the internal electrodes 14. Subsequently, the front and rear main surfaces 30A and 30B of the oxide base material 30 are, as illustrated in FIG. 5(B), ground by a predetermined thickness so that end portions 14A and 14B of the internal electrode 14 formed in the oxide base material 30 in an embedded manner are exposed so as to have a predetermined length. Subsequently, the resin 12 is, as illustrated in FIG. 5(C), impregnated so as to cover the part exposed in the preceding process. Then, the resin 12 is cut at a position indicated by the broken line in FIG. 5(C) to expose the end portions 14A and 14B of the internal electrode 14 (FIG. 5(D)). As a result, as evident from FIG. 5(D), the internal electrode 14 is constituted so that the end portions 14A and 14B of the internal electrode 14 are substantially on the same plane as the surface of the resin 12 provided on the surface of the base material. Finally, external conductive layers 56 and 58 are, as illustrated in FIG. 5(E), formed on a part of the main surfaces 52A and 52B so that a part of the plurality of internal electrodes 14 is electrically connected on the front and rear of the through electrode layer 52, whereby the interposer 50 according to the present embodiment is provided. A material similar to that of Embodiment 1 is used for the resin 12; and Cu, Ni, solder, or multilayer electrode of these materials is used for the external conductive layers 56 and 58, for example.

The overall thickness of the interposer 50 produced as described above is several dozen μm to several hundred μm, for example; and the thickness of the stress buffer units 54A and 54B is several hundred nm to several dozen μm. Though omitted in the process illustrated in FIG. 5, a process may be added by which, in order to protect the internal electrode 14 not connected to the external conductive layers 56 and 58, firstly, the main surfaces 52A and 52B of the through electrode layer 52 is coated with flexible resin not illustrated in the drawings before the external conductive layers 56 and 58 are formed, and thereafter opening windows are formed only in that part of the main surfaces 52A and 52B in which the external conductive layers 56 and 58 are arranged.

An exemplary application of the present embodiment will be described with reference to FIG. 6. A circuit module 60 illustrated in FIG. 6 includes the interposer 50 according to the present embodiment and electronic components 24 and 26 mounted on the surface of the interposer 50. In the illustrated example, the interposer 50 includes an insulating layer 62 made of flexible resin on the front and rear main surfaces 52A and 52B of the through electrode layer 52; the insulating layer 62 is for protecting the internal electrode 14 not connected to the external conductive layers 56 and 58. The external conductive layers 56 on the front side of the interposer 50 are connected via joint units 25A, 25B, 26A and 26 B to terminal units 24A and 24B of the electronic component 24 and terminal units (not illustrated) of the electronic component 26. Solder is used for the joint units 25A, 25B, 26A and 26 B, for example. Meanwhile, the external conductive layers 58 on the rear side of the interposer 50 are used as wiring or electrode pad for connection with the internal electrodes 14 connected to the electronic components 24 and 26. The external conductive layer 58 has a function of land for mounting and is conductively connected via a conductive joint material, for example, on a land on the surface of a mother board (not illustrated). Or, the external conductive layer 58 is used as a rewiring layer for conversion of wiring pitch between the electronic components 24 and 26 and a mother board.

In this way, in Embodiment 2, many internal electrodes 14 of the interposer 50 are used to connect the electronic components 24 and 26 to a board (a mother board (not illustrated) or the like). Accordingly, due to an operation similar to that of Embodiment 1, stress from the electronic components 24 and 26 and the board is absorbed by the stress buffer units 54A and 54B of the interposer 50, so that mounting reliability is improved.

The present invention is not limited to the aforementioned embodiments, and many changes or modifications to the embodiments are possible without departing from the gist of the invention. For example, the following can be included in the technical scope of the invention: (1) The configuration and dimensions in the aforementioned embodiments are merely exemplary of the invention and may be adequately varied as required; (2) The materials illustrated in the embodiments are also exemplary and may be adequately changed as long as similar effects are achieved. For example, in Embodiment 1, aluminum is used for the valve metal which is used to form the oxide base material 30, but well-known metals of various kinds may be used as long as anodic oxidation can be made; (3) In Embodiment 1, the oxide base material 30 is used as a mold, and after the oxide base material 30 has been entirely removed, the resin 12 is filled, as a replacement, in the void space 36 between the internal electrodes 14. In Embodiment 2, the stress buffer units 54A and 54B are provided which is obtained by replacing only the vicinity of the front and rear surfaces of the oxide base material 30 with the resin 12, but the percentage of replacement of the oxide base material 30 by the resin 12 may be adequately varied as required. That is, the oxide base material 30 may be entirely or partly replaced with the resin 12, and that part of the oxide base material 30 which is replaced may be adequately changed; (4) As for the configuration of connection with the electronic components 24 and 26 or with the wiring board 20, also, the above-described embodiments are merely exemplary of the invention. The design thereof may be adequately changed as long as the same effects are achieved; (5) In Embodiment 2, the present invention is applied to the interposer 50 of the circuit module 60, but this is also exemplary of the invention. For example, the present invention may be applied to a module board allowing wiring design or to an impedance element, which double as an interposer.

INDUSTRIAL APPLICABILITY

The above-described embodiments of the present invention utilize remarkable flexibility of the internal electrode and deformation of the insulating material having a small Young's modulus and thus can absorb or release stress acting on the joint portions of mounted components; accordingly, the invention is applicable to a stress buffer layer. Particularly, since stress acting on a solder joint portion can be released, the invention is suitable for applications to a joint material used to improve mounting reliability. Particularly, significant advantageous effects are achieved in vehicle-mounted components requiring guaranteed operation under high temperature or component mounting boards which include multiple sorts of materials or multiple electrode pitches in a mixed manner.

REFERENCE SIGNS LIST 10 stress buffer sheet
12 resin
13 through electrode layer
14 internal electrode (metal pillar)
14A, 14B end portion
16A, 16B external conductive layer
20 wiring board
22A, 22B terminal unit
24, 26 electronic component
24A, 24B terminal unit
25A, 25B, 26A, 26B joint portion
30 oxide base material
30A, 30B main surface
32 hole 34 seed layer
36 void space
50 interposer
52 through electrode layer
52A, 52B main surface
54A, 54B stress buffer unit
56, 58 external conductive layer
60 circuit module
62 insulating layer

The invention claimed is:

1. A stress buffer layer comprising:
a plate-like base material made of an anodic oxide of a valve metal that has been subject to anodic oxidation, the base material having a top surface and a bottom surface each covered by a pair of insulating material layers made of an insulating material having a Young's modulus smaller than the anodic oxide of the valve metal, the base material having many through holes penetrating through the top surface and the bottom surface which are formed during the anodic oxidation of the valve metal; and
an internal electrode filled in the many through holes and conductively connected directly or indirectly to an electronic component, wherein both ends of the internal electrode are formed so as to be substantially on the same plane as the top and bottom surfaces of the base material at a point in time immediately before the internal electrode is connected to the electronic component.

2. The stress buffer layer according to claim 1, wherein the insulating material is resin.

3. The stress buffer layer according to claim 1, further comprising an external conductive layer arranged on at least one of the top surface and the bottom surface of the plate-like base material and conductively connected to at least one of the many internal electrodes.

* * * * *